(12) United States Patent
Fukuda

(10) Patent No.: US 7,406,637 B2
(45) Date of Patent: Jul. 29, 2008

(54) SEMICONDUCTOR MEMORY DEVICE CAPABLE OF TESTING MEMORY CELLS AT HIGH SPEED

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 11/008,270

(22) Filed: Dec. 10, 2004

(65) Prior Publication Data

US 2005/0152190 A1 Jul. 14, 2005

(30) Foreign Application Priority Data

Dec. 12, 2003 (JP) ............... 2003-414596

(51) Int. Cl.
*G11C 29/00* (2006.01)
*G11C 7/00* (2006.01)

(52) U.S. Cl. .................. 714/718; 714/710; 365/201

(58) Field of Classification Search .................. 714/718
See application file for complete search history.

(56) References Cited

U.S. PATENT DOCUMENTS

| 5,668,815 | A  | * | 9/1997  | Gittinger et al. ............. 714/719 |
| 6,591,385 | B1 | * | 7/2003  | Krech et al. ................. 714/718 |
| 6,601,199 | B1 |   | 7/2003  | Fukuda et al. |
| 6,661,839 | B1 | * | 12/2003 | Ishida et al. ................. 375/240 |
| 6,779,140 | B2 | * | 8/2004  | Krech et al. ................. 714/718 |
| 6,834,364 | B2 | * | 12/2004 | Krech et al. ................... 714/45 |
| 6,851,076 | B1 | * | 2/2005  | Cook et al. .................. 714/718 |
| 6,934,884 | B1 | * | 8/2005  | Wakabayashi et al. ........ 714/30 |
| 2002/0133769 | A1 | * | 9/2002 | Cowles et al. ............... 714/719 |

FOREIGN PATENT DOCUMENTS

| JP | 11-329000       | 11/1999 |
| JP | 2000-133000     | 5/2000  |
| JP | 2000285700 A  * | 10/2000 |

OTHER PUBLICATIONS

Wohl et al. "Efficient Compression and Application of Deterministic Patterns in a Logic BIST Architecture," 40th Design Automation Conference pp. 566-575 (2003).*

* cited by examiner

*Primary Examiner*—Cynthia Britt
(74) *Attorney, Agent, or Firm*—Oblon, Spivak, McClelland, Maier & Neustadt, P.C.

(57) ABSTRACT

A semiconductor memory device comprises a memory core, data control circuit, flag register, data register and computation circuit. The memory core has a plurality of memory cells for storing data. The data control circuit writes and reads first test data to and from the memory cells in synchrony with a clock signal. The flag register stores a plurality of flag data items. The data register stores second test data input corresponding to input of a command. The computation circuit performs, at every cycle, computation of the second test data, stored in the data register, and each of the flag data items stored in the flag register, thereby generating the first test data, until an n-th (n is a positive integer) cycle of the clock signal is reached. The first test data is written to the memory cells by the data control circuit.

8 Claims, 13 Drawing Sheets

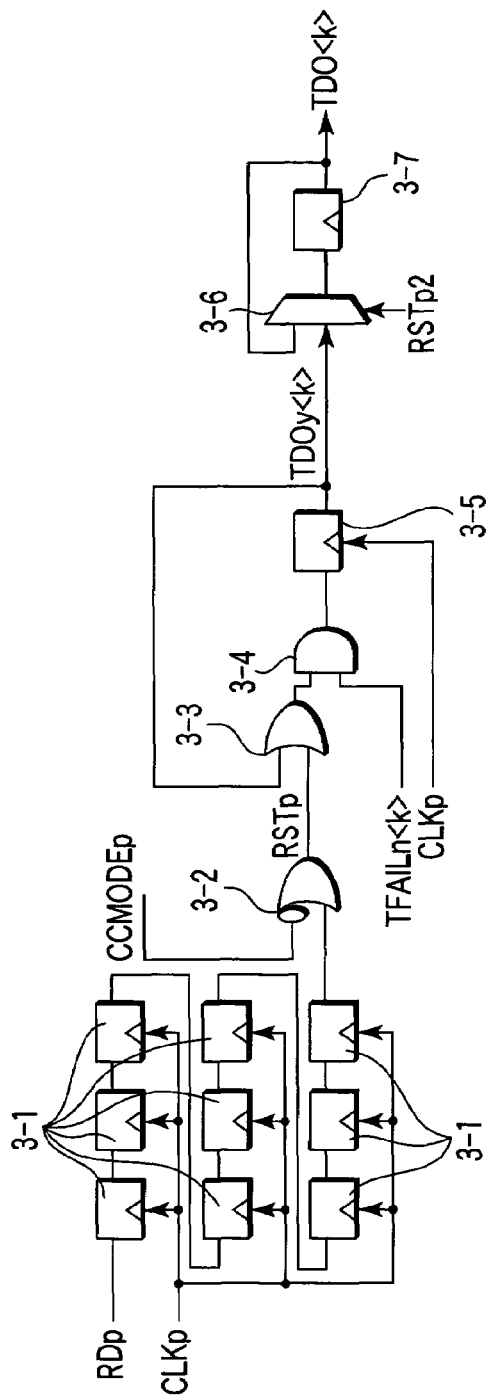
F I G. 6
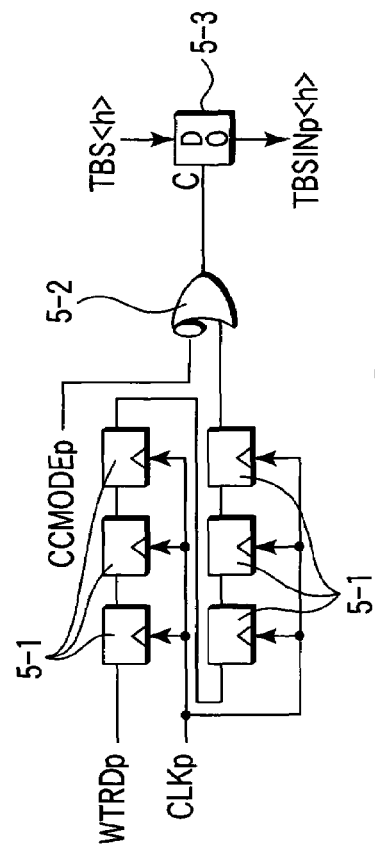
F I G. 7

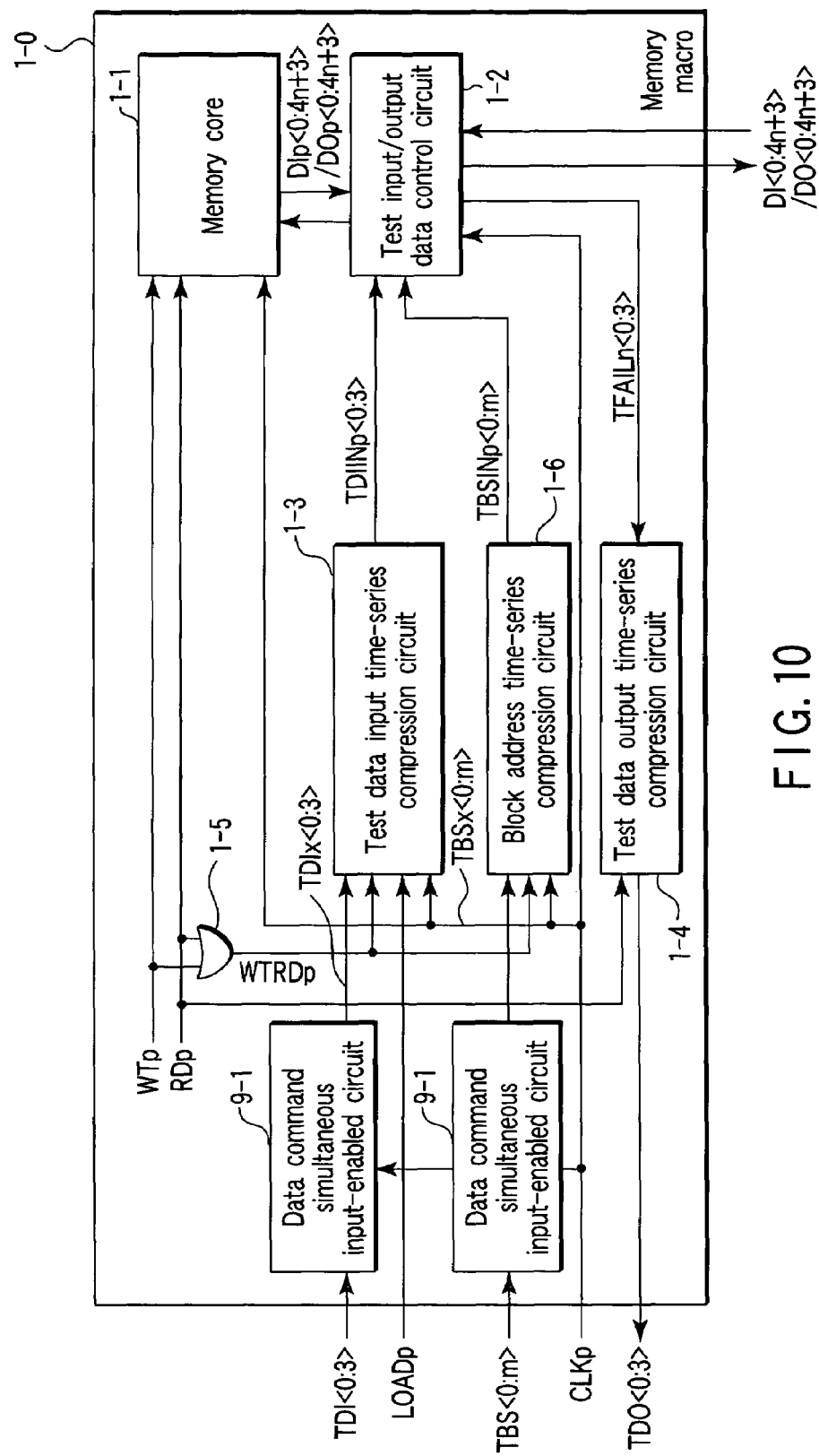
F I G. 10

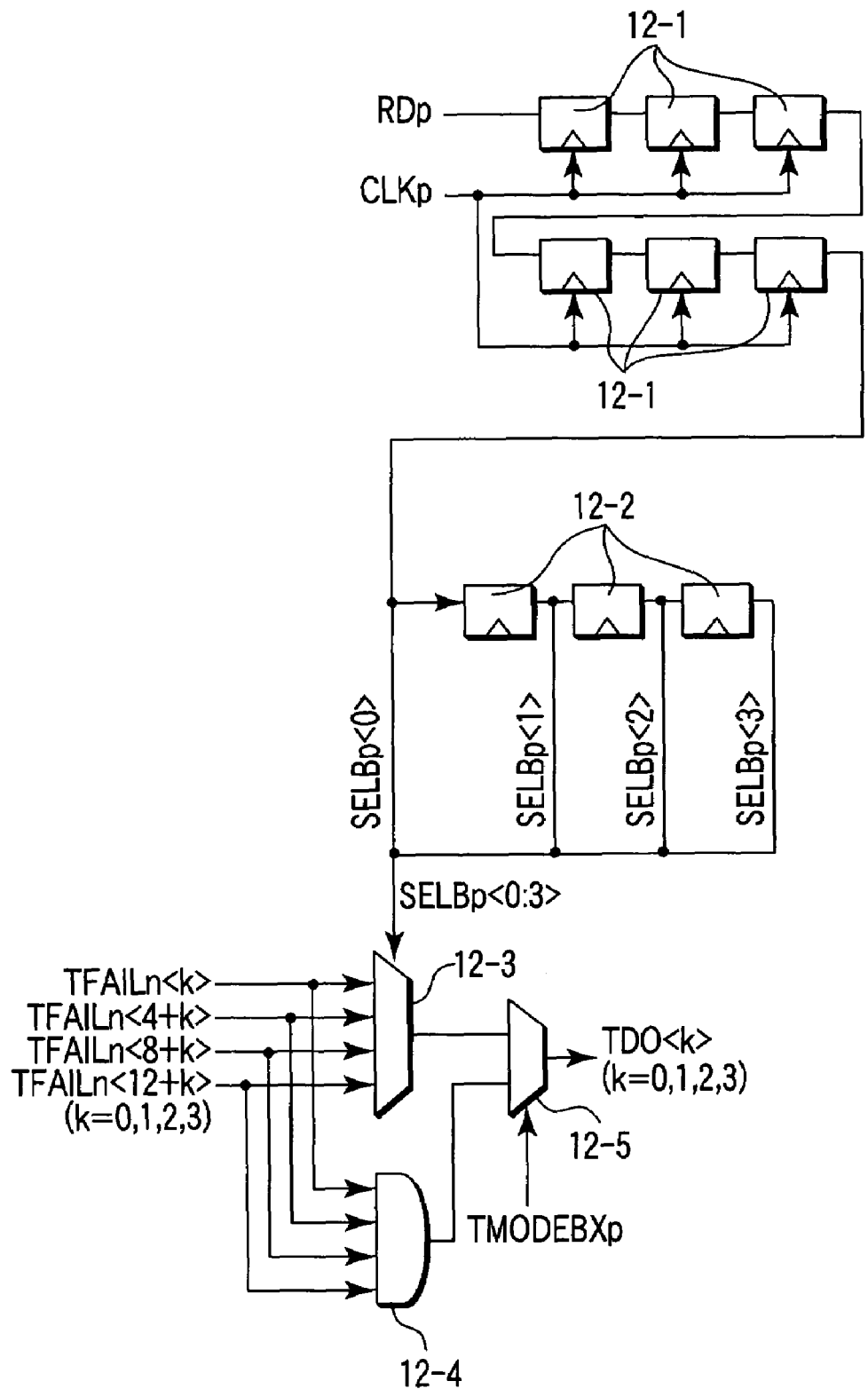
F I G. 14

SEMICONDUCTOR MEMORY DEVICE CAPABLE OF TESTING MEMORY CELLS AT HIGH SPEED

CROSS-REFERENCE TO RELATED APPLICATIONS

This application is based upon and claims the benefit of priority from prior Japanese Patent Application No. 2003-414596, filed Dec. 12, 2003, the entire contents of which are incorporated herein by reference.

BACKGROUND OF THE INVENTION

1. Field of the Invention

The present invention relates to a semiconductor memory device, and more particularly to a semiconductor memory device whose memory cells can be tested at high speed.

2. Description of the Related Art

In recent semiconductor memory devices, there is a demand for testing memory cells at high speed in accordance with remarkable increases in memory capacity. However, since the speed of an external clock signal supplied from the outside of the memory devices cannot be increased, a phase-locked loop (PLL) is installed in the device to make the internal circuit operate at high speed (see, for example, Jpn. Pat. Appln. KOKAI Publication No. 11-329000). In this case, when testing a memory, the input/output circuit (IO) does not operate at high speed, therefore a high frequency signal cannot be applied to the memory from outside. In other words, high-speed testing cannot be performed. In particular, in memory-combined LSIs in which a memory circuit and logic circuit are combined in a single semiconductor substrate, the memory macro that constitutes the memory circuit is demanded to operate at very high speed. However, in many cases, it cannot be tested from the outside whether the memory macro can operate at high speed. Furthermore, a high-speed memory tester is very expensive, therefore impractical.

A conventional semiconductor memory device example will now be described.

FIG. 1 is a block diagram illustrating a memory macro incorporated in a conventional memory-combined LSI. A memory macro 1-0 comprises a memory core 1-1 and test input/output data control circuit 1-2. The memory core 1-1 has a plurality of memory cells. A write command WTp, read command RDp, clock CLKp and address (not shown) are input to the memory core 1-1. Further, the test input/output data control circuit 1-2 is connected to data input lines DI<0:4n+3> (n: a natural number including 0), and to data output lines DO<0:4n+3>.

Upon receiving the write command WTp, the memory macro 1-0 writes the data, input to data input lines DI<0:4n+3>, to memory cells of an address corresponding to the data input lines. Further, upon receiving the read command RDp, the memory macro 1-0 reads data from the memory cells of the corresponding address, and outputs the read data from data output lines DO<0:4n+3>.

The memory macro 1-0 incorporated in a memory-combined LSI has a large number of data input/output lines. In a standard test, a test is performed using test data input lines TDI<0:3> and test data output lines TDO<0:3> (in this case, the simultaneous use of test data of 4 bits is assumed). The test input/output data control circuit 1-2 controls the input/output of test data. Since the number of standard data input/output lines is 4(n+1) and the number of test data input/output lines is 4, the standard data input/output lines are divided into a number (n+1) of blocks to be accessed. A block selection address TBS<0:m> is a signal for selecting a particular one of the number (n+1) of blocks. "m" is also a natural number including 0, and "m" and "n" satisfy $2^{m+1} \geq n+1$.

The test data input lines TDI<0:3> for receiving test data from the outside and the test data output lines TDO<0:3> for outputting test data to the outside are connected to the test input/output data control circuit 1-2. Further, a clock CLKp is input to the test input/output data control circuit 1-2.

Referring to FIG. 8, signal generation timing for testing the memory macro shown in FIG. 1 will be described. Signals SELCYCLEp<0:3> and RTSp are irrelevant to this explanation, therefore may be ignored. A clock (signal) CLK is an external clock supplied from the outside. A test command TCMD is not shown in FIG. 1, and is a signal obtained by multiplexing the read command RDp and write command WTp. The test command TCMD indicates the timing of input of the write command WTp or read command RDp. One latency (period), which corresponds to one pulse (cycle) of the clock CLK, is required for capturing each command. This is represented by a command CMD. A read command RD0, write command WT1 and read command RD2 are sequentially input at every fourth cycle of the clock CLK. Addresses are input at the same timing as the commands (this is not shown).

Data is input six clocks later than the input of a command. When the read command RDp is input, data of four cycles is output. When the write command WTp is input, data of four cycles is input. The test data input to the test data input lines TDI six to nine cycles after the input of the read command RD0 is used as expected value data EXP. Data items D0, D1, D2 and D3 as the expected value data EXP are compared with data items R0, R1, R2 and R3 as output data DO, respectively. As shown in FIG. 8, the comparison results are output two cycles later than the start of comparison. In the case of FIG. 8, only the data R1 of the second cycle is not equal to the comparison data (Fail), and the other data items R0, R2 and R3 are equal to the respective comparison data items (Pass).

To test the internal memory of the semiconductor memory device shown in FIG. 1, using an internal clock four times faster than a slow (low-frequency) external clock, it is needed to input data at a speed four times faster than the external clock, which is impossible. Further, it is needed to output data at the speed four times faster than the external clock. Alternatively, it is needed to repeat the same test four times to output data at different points in time.

BRIEF SUMMARY OF THE INVENTION

According to an aspect of the present invention, there is provided a semiconductor memory device comprising: a memory core having a plurality of memory cells which store data; a data control circuit configured to write and read first test data to and from the memory cells in synchrony with a clock signal; a flag register which stores a plurality of flag data items; a data register which stores second test data input upon input of a command; and a computation circuit configured to perform, at every cycle of the clock signal, computation of the second test data, stored in the data register, and each of the flag data items stored in the flag register, thereby generating the first test data, after the second test data is input and until an n-th (n is a positive integer) cycle of the clock signal is reached, the first test data being written to the memory cells by the data control circuit.

BRIEF DESCRIPTION OF THE SEVERAL VIEWS OF THE DRAWING

FIG. 6 is a circuit diagram illustrating the configuration of a test data output time-series compression circuit incorporated in the semiconductor memory device of the first embodiment;

FIG. 7 is a circuit diagram illustrating the configuration of a block address time-series compression circuit incorporated in the semiconductor memory device of the first embodiment;

FIG. 10 is a block diagram illustrating the configuration of a modification of the first embodiment;

FIG. 14 is a circuit diagram illustrating the configuration of a time-series inter-block data expansion circuit/multiplexer incorporated in the semiconductor memory device of the second embodiment;

DETAILED DESCRIPTION OF THE INVENTION

Figure 1:
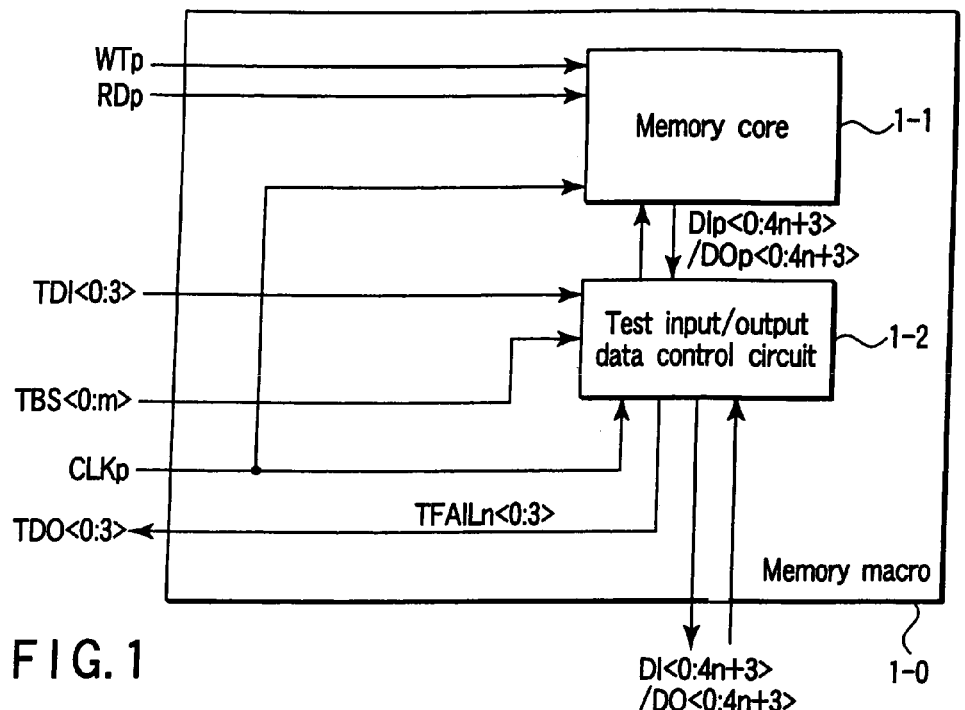
FIG. 1 is a block diagram illustrating the configuration of a memory macro incorporated in a conventional memory-combined LSI.

Semiconductor memory devices for use in a memory-combined LSI, according to embodiments of the invention will be described in detail with reference to the accompanying drawings. In the drawings, like elements are denoted by like reference numerals.

FIRST EMBODIMENT

Firstly, a semiconductor memory device according to a first embodiment of the invention will be described.

Figure 2:
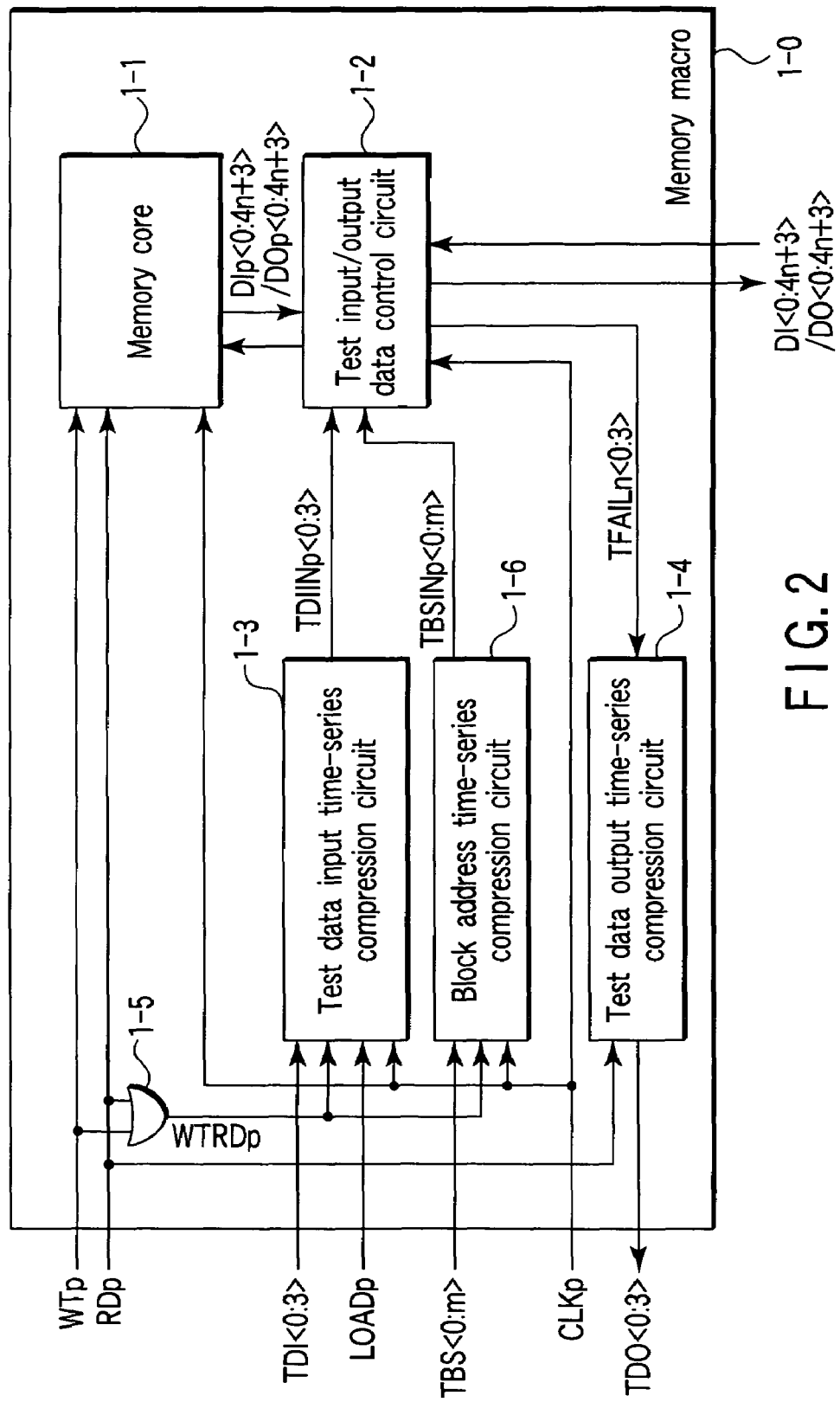
FIG. 2 is a block diagram illustrating the configuration of a semiconductor memory device according to a first embodiment of the invention.

FIG. 2 is a block diagram illustrating the configuration of the semiconductor memory device of the first embodiment. This semiconductor memory device comprises a plurality of memory macros. One of the memory macros will hereinafter be described.

A memory macro 1-0 comprises a memory core 1-1, test input/output data control circuit 1-2, test data input time-series compression circuit 1-3, test data output time-series compression circuit 1-4, logical OR circuit (hereinafter referred to as an "OR circuit") 1-5 and block address time-series compression circuit 1-6.

The memory core 1-1 has a plurality of memory cells. A write command WTp, read command RDp, clock CLKp and address (not shown) are input to the memory core 1-1. Further, the test input/output data control circuit 1-2 is connected to data input lines DI<0:4$n$+3> (n: a natural number including 0), and to data output lines DO<0:4$n$+3>. Upon receiving the write command WTp, the memory macro 1-0 writes the data, input to data input lines DI<0:4$n$+3>, to memory cells corresponding to the address input to the memory core 1-1. Further, upon receiving the read command RDp, the memory macro 1-0 reads data from the memory cells corresponding to the address input to the memory core 1-1, and outputs it through the data output lines DO<0:4$n$+3>.

Each memory macro 1-0 incorporated in the memory-combined LSI includes a number of data input/output line. In a standard test, each memory macro 1-0 is tested using test data input lines TDI<0:3> and test data output lines TDO<0:3> (in this case, the simultaneous use of test data of 4 bits is assumed). At this time, the test input/output data control circuit 1-2 controls the input/output of test data. Since the number of standard data input/output lines is 4(n+1) and that of test data input/output lines is 4, the standard data input/output lines are divided into a number (n+1) of blocks to be accessed. A block selection address TBS<0:m> is a signal for selecting a particular one of the number (n+1) of blocks. "m" is also a natural number including 0, and "m" and "n" satisfy $2^{m+1} \geq n+1$.

The test data input from outside to the data input lines TDI<0:3> is passed through the test data input time-series compression circuit 1-3, and input as data TDIINp<0:3> to the test input/output data control circuit 1-2. The test input/output data control circuit 1-2, in turn, outputs data TFAILn<0:3> to the test data output lines TDO<0:3> via the test data output time-series compression circuit 1-4. The clock CLKp is input to the test input/output data control circuit 1-2, test data input time-series compression circuit 1-3 and test data output time-series compression circuit 1-4.

Figure 3:
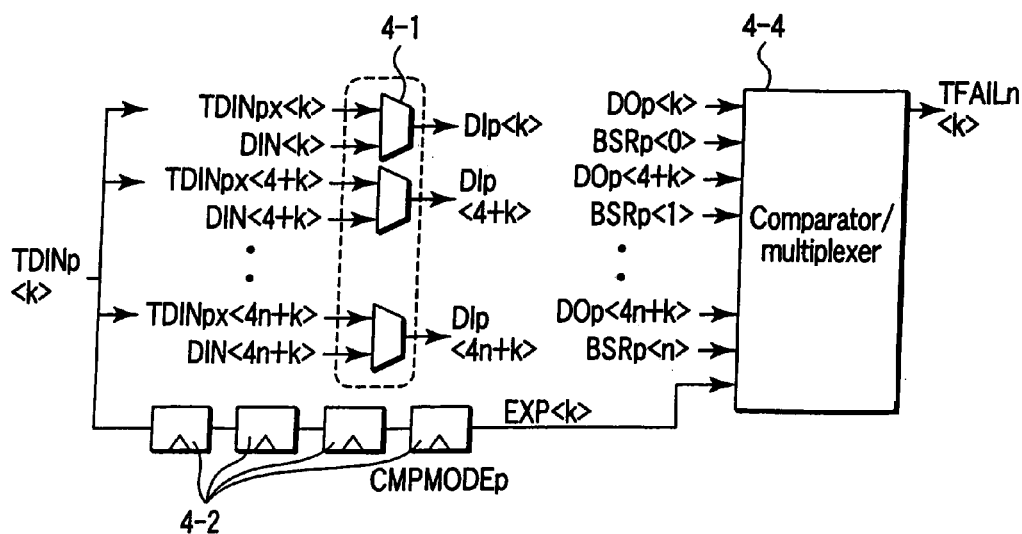
FIG. 3 is a circuit diagram illustrating the configuration of a test input/output data control circuit incorporated in the semiconductor memory device of the first embodiment.

FIG. 3 shows a configuration example of the test input/output data control circuit 1-2. Test data TDINp<k> (k=0, 1, 2, 3) is the data input to the test data input lines TDI<0:3>. A multiplexer 4-1 outputs test data TDINpx<k> in a test mode, and data DIN<k> in a normal mode. In other words, in the test mode, the multiplexer 4-1 selects test data TDINpx<k>, TDINpx<4+k>, . . . , TDINpx<4n+k>, and outputs them as data DIp<k>, DIp<4+k>, . . . , DIp<4n+k>. Whether the output data is written to memory cells is selected by the block selection address TBS<0:m>. However, no description is given of this operation.

Since the test data TDINpx<k> also serves as expected value data EXP<k> used during reading, flip-flops 4-2 are incorporated for delaying the output of the test data TDINpx<k> by the latency required for the expected value data during reading. The output of the flip-flops 4-2 is input as expected value data EXP<k> to a comparator/multiplexer (comparison/selection circuit) 4-4.

Output data DOp<f>, not shown, is directly connected to data output lines DO<f> (f=0, 1, 2, . . . , 4n−1). An address BSRp<0:n> activates (sets "H") only the block selected by the block selection address TBS<0:m> during reading. The address BSRp<0:n> is obtained by delaying the block selection address TBS<0:m> by the latency during reading, and decoding the delayed address (a plurality of blocks can be selected using an address masking function). Output data DOp<4e+k> (e: an integer that satisfies 0≦e≦n) and address BSRp<e> corresponding thereto are input to the comparator/multiplexer 4-4.

The comparator/multiplexer 4-4 outputs data TFAILn<k> to a test data output line TDO<k>. In a mode other than an expected value comparison mode, the comparator/multiplexer 4-4 outputs, as the data TFAILn<k>, the output of the block selected by the address BSRp<e>. In the expected value comparison mode, the comparator/multiplexer 4-4 compares, with the expected value data EXP<k>, the output data DOp<4e+k> output from the block (or blocks) selected by the address BSRp<e>. Only if all the output data DOp<4e+k> is identical to the expected value data EXP<k>, the data TFAILn<k> is "H". If not, the data TFAILn<k> is "L".

Figure 4:
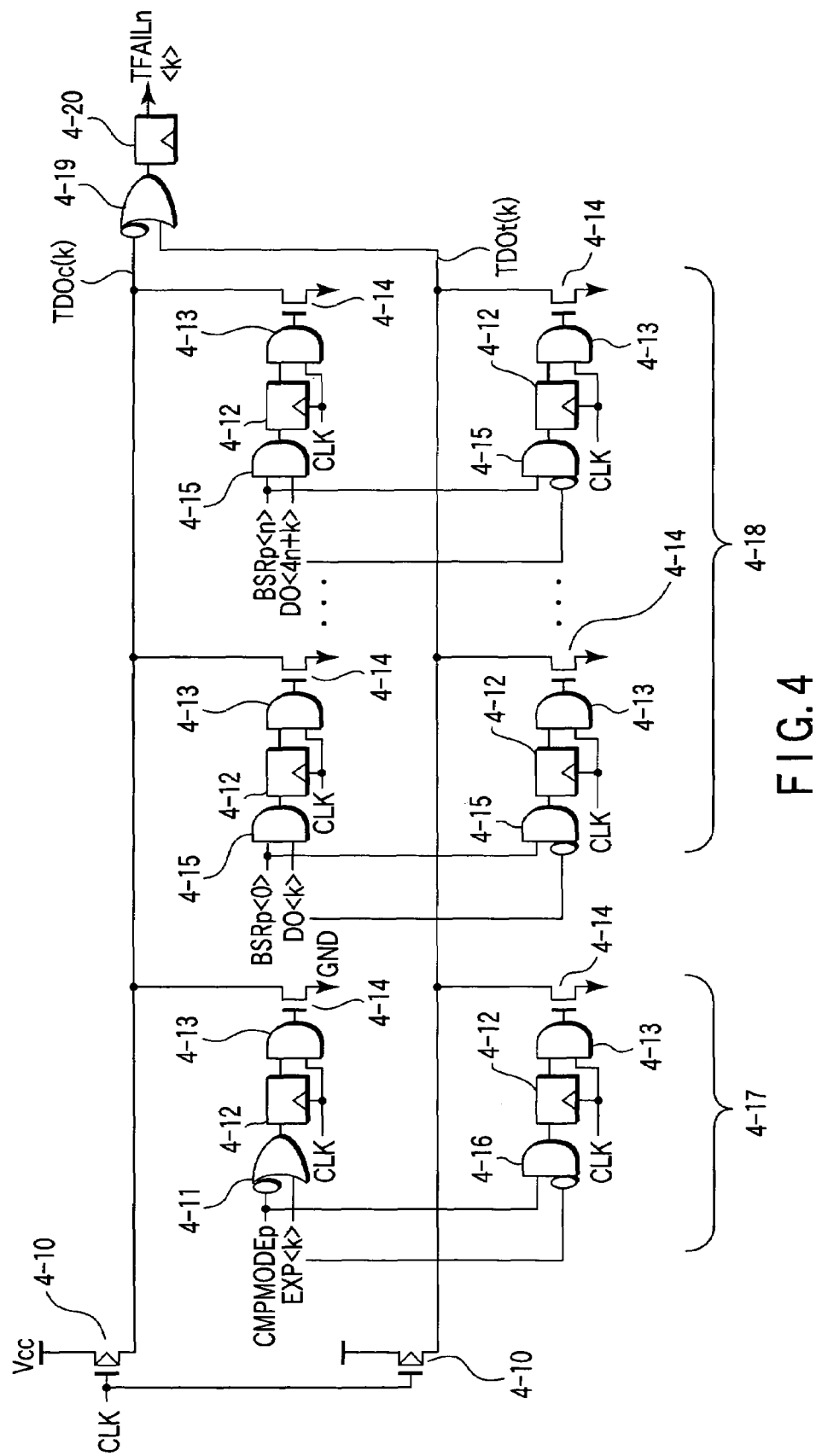
FIG. 4 is a circuit diagram illustrating the configuration of a comparator/multiplexer incorporated in the test input/output data control circuit.

FIG. 4 shows a circuit example of the comparator/multiplexer 4-4. A signal CMPMODEp is activated (becomes "H") in the expected value comparison mode. There are two P-channel MOS transistors (hereinafter referred to as "Pch transistors") 4-10. The Pch transistors have gates supplied with a clock CLK, sources supplied with a power supply potential Vcc, and respective drains connected to test data output lines TDOc<k> and TDOt<k> that are complementary data lines.

When the clock CLK is at "L", the test data output lines TDOc<k> and TDOt<k> are pre-charged with "H". The output of each D latch 4-12 is connected to one input of a corresponding logical product circuit (hereinafter referred to as an "AND circuit") 4-13, while the clock CLK is input to the other input of each AND circuit 4-13. The output of each AND circuit 4-13 is connected to the gate of a corresponding N-channel MOS transistor (hereinafter referred to as an "Nch transistor") 4-14. In total, a number 2(n+2) of Nch transistors are provided. The source of each Nch transistor is grounded. The drains of a number (n+2) of Nch transistors are commonly connected to the test data output line TDOc<k>, while the drains of the other Nch transistors are commonly connected to the other test data output line TDOt<k>. Further, an OR circuit 4-11 and AND circuit 4-16 are provided. In the expected value comparison mode, i.e., if the signal CMPMODEp is at "H", the expected value data EXP<k> and its inverted signal are input to the respective D latches 4-12 via the OR circuit 4-11 and AND circuit 4-16.

Each D latch 4-12 and corresponding AND circuit 4-13 and Nch transistor 4-14 form one group. If the clock CLK is at "H" and the input of each D latch 4-12 is at "H", the potential of the test data output lines TDOc<k> and TDOt<k> connected to the drains of the Nch transistors 4-14 drops to "L".

In a data input section 4-18, if the output data DOp of the block selected by the address BSRp is at "H", the potential of the test data output line TDOc<k> drops to "L". On the other hand, if the output data DOp of the block selected by the address BSRp is at "L", the potential of the test data output line TDOt<k> drops to "L". The test data output lines TDOc<k> and TDOt<k> are connected to the inputs of an OR circuit 4-19. The output of the OR circuit 4-19 is connected to a flip-flop 4-20 for receiving a clock in an inverted state. The output of the flip-flop 4-20 is the data TFAILn<k>.

In the expected value comparison mode, the signal DMPMODEp is at "H", and the expected value is reflected in the potential of the test data output lines TDOc/t<k> in an expected value input section 4-17. If the data DO of the block(s) selected by the address BSRp is identical to the expected value data EXP<k>, the potential of only one of the test data output lines TDOc<k> and TDOt<k> drops to "L". Accordingly, the output level of the OR circuit 4-19 becomes "H", therefore the level of the data TFAILn<k> becomes "H". On the other hand, if the data OD of even one of the blocks selected by the address BSRp differs from the expected value data EXP<k>, the potential of both the test data output lines TDOc<k> and TDOt<k> drops to "L". Accordingly, the output level of the OR circuit becomes "L" (fail), the level of the data TFAILn<k> also becomes "L".

In a mode other than the expected value comparison mode, the signal CMPMODEp is at "L", and the test data output line TDOc<k> is also at "L". If the data OD of the block(s) selected by the address BSRp is at "H", the level of the test data output line TDOt<k> does not drop to "L", therefore the data TFAILn<k> is also at "H". On the other hand, if the data DO of the block(s) selected by the address BSRp is at "L", the level of the test data output line TDOt<k> drops to "L", therefore the level of the data TFAILn<k> also becomes "L" (data is read from the selected block(s)).

The block selection address TBS<0:m> is input as an address TBSINp<0:m> to the test input/output data control circuit 1-2 via the block address time-series compression circuit 1-6. Upon the generation of either the write command WTp or the read-command RDp, a command WTRDp as the output of the OR circuit 1-5 is activated to assume the "H" level. The command WTRDp is input to the test data input time-series compression circuit 1-3 and block address time-series compression circuit 1-6.

Figure 5:
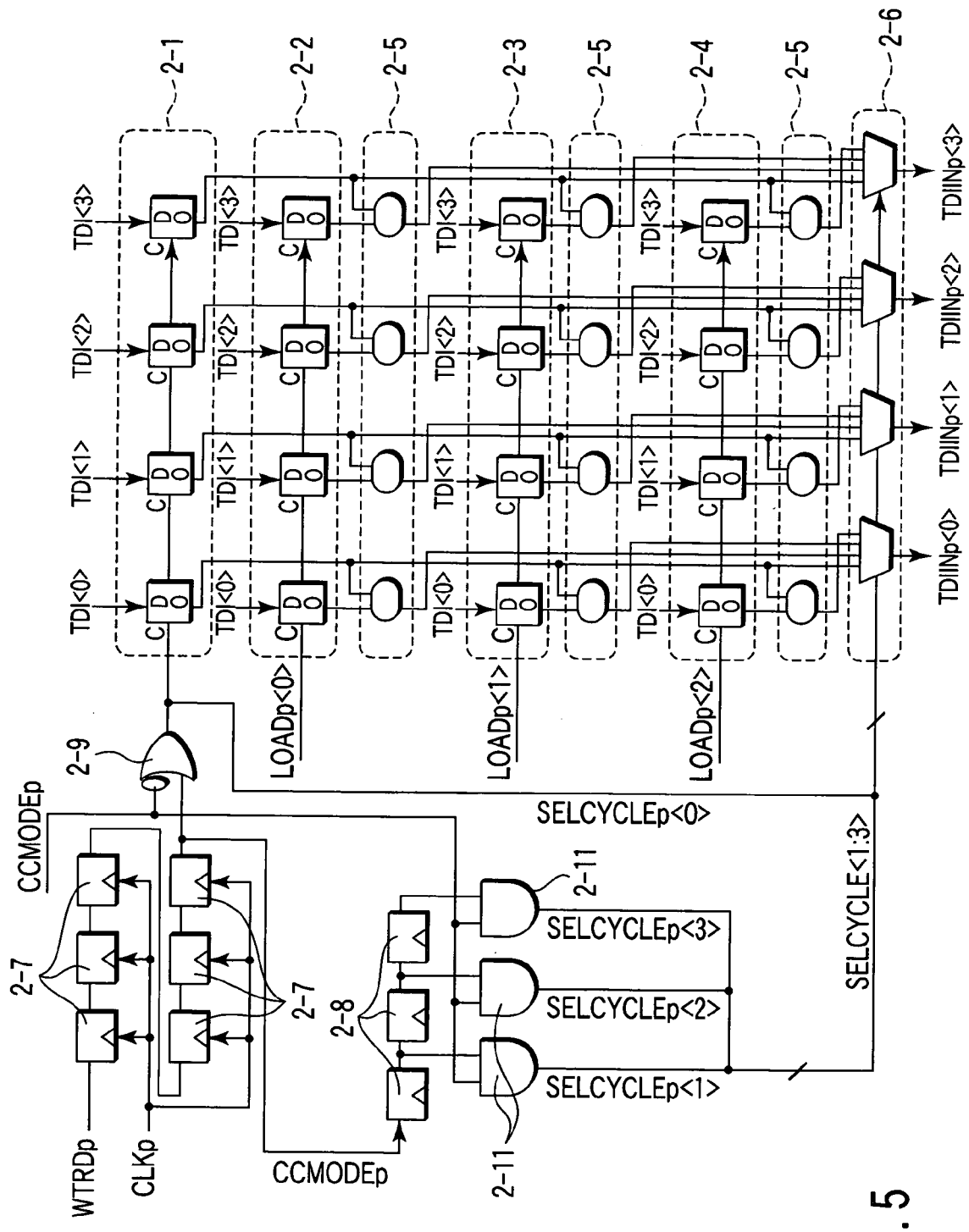
FIG. 5 is circuit diagram illustrating the configuration of a test data input time-series compression circuit incorporated in the semiconductor memory device of the first embodiment.

FIG. 5 is circuit diagram illustrating the configuration of the test data input time-series compression circuit 1-3 incorporated in the memory macro 1-0. The command WTRDp is input to one input terminal of an OR circuit 2-9 via flip-flops 2-7 that are used for adjusting the latency required from command input to data input. The command WTRDp is also input to counter flip-flops 2-8 via the flip-flops 2-7. The inverted signal of a signal CCMODEp is input to the other input terminal of the OR circuit 2-9. The signal CCMODEp indicates whether the present mode is the compression mode, and is activated to assume the "H" level if the present mode is the compression mode.

A signal SELCYCLEp<0> as the output of the OR circuit 2-9 is input to "0 cycle" data registers 2-1 and multiplexers 2-6. If the present mode is not the compression mode, the signal CCMODEp is at "L", and a signal of "H" is input to the OR circuit 2-9. Accordingly, the signal SELCYCLEp<0> is always activated to assume the "H" level. The counter flip-flop 2-3 is reset by the signal SELCYCLEp<0>, which is not shown.

One "0 cycle" data register 2-1 is provided for each test data input line TDI<0:3>, i.e., four "0 cycle" data registers 2-1 are provided in total. A clock CLKp (not shown) is input to the "0 cycle" data registers 2-1. Basically, if the terminal C of each register 2-1 is activated to assume the "H" level, the value at the terminal D of each register 2-1 is captured and output from the terminal O of each register 2-1. The signal SELCYCLEp<0> as the output of the OR circuit 2-9 is input to the terminals C of the four "0 cycle" data registers 2-1. The terminals D of the registers 2-1 are connected to the respective test data input lines TDI<0:3>. Accordingly, if the present mode is not the compression mode, the signal SELCYCLEp<0> is always at "H", and the "0 cycle" data registers 2-1 capture the respective test data items, input to the tests data input lines TDI<k> (k=0, 1, 2, 3), in synchrony with each pulse of the clock CLKp. Further, in the compression mode, the write command WRp or read command RDp is input, and test data is captured by the "0 cycle" data registers 2-1 after the latency required from command input to data input elapses. If the input period of the write command or read command is four cycles, the "0 cycle" data registers 2-1 capture, in units of four cycles, the respective test data items input to the tests data input lines TDI<k> (k=0, 1, 2, 3).

The respective outputs of the counter flip-flops 2-8 are input to one input terminal of each of AND circuits 2-11. The signal CCMODEp is input to the other input terminals of the AND circuits 2-11. The AND circuits 2-11 output respective signals SELCYCLEp<1:3>. If the present mode is not the compression mode, the signal CCMODEp is at "L", therefore the signals SELCYCLEp<1:3> are kept in the inactive state, i.e., kept at "L".

The signals SELCYCLEp<0:3> serving to select the multiplexers 2-6 are input to the multiplexers 2-6. Four "+1 cycle" flag registers 2-2, four "+2 cycle" flag registers 2-3 and four "+3 cycle" flag registers 2-4 are provided for the four test data input lines TDI<0:3>, respectively. The clock CLKp is input to the flag registers, which is not shown.

The flag registers 2-2 to 2-4 operate in the same manner as the "0 cycle" data registers 2-1. Signals, which are activated to assume the "H" level when load instructions LOADp<0:2> are issued, are input to the respective terminals C of the registers 2-2 to 2-4. The load instructions LOADp<0:2> are used to load the flag registers 2-2 to 2-4 with data before starting a test. The test data supplied to the test data input lines TDI<0:3> is input to the terminals D of the flag registers 2-2 to 2-4, and is captured by the flag registers 2-2 to 2-4 when the load instructions are generated.

The output of each of the flag registers 2-2 to 2-4 is input to one input terminal of the corresponding operational unit 2-5. The output of each of the "0 cycle" data registers 2-1 is input to the other input terminal of the corresponding operational unit 2-5. The outputs of the operational units 2-5 corresponding to each test data input line TDI<0:3>, and the output of the "0 cycle" data register 2-1 corresponding to each test data input line TDI<0:3> are input to the multiplexer 2-6 corresponding to each test data input line TDI<0:3>. The multiplexers 2-6 output respective data items TDIINp<k> (k=0, 1, 2, 3). Operational units having an exclusive OR (EXOR) function are often used as the operational units 2-5. In this case, the data stored in the flag registers functions as an inversion flag for inverting the data stored in the data registers.

When the signal SELCYCLEp<0> is at "H", each multiplexer 2-6 outputs its leftmost input data in FIG. 5 (the output data of the corresponding data register 2-1). On the other hand, when the signal SELCYCLEp<1> is at "H", each multiplexer 2-6 outputs its second input data from the left in FIG. 5, i.e., the output data of the corresponding operational unit 2-5 that receives the output of the corresponding flag register 2-2. Similarly, when the signal SELCYCLEp<2> is at "H", each multiplexer 2-6 outputs its third input data from the left in FIG. 5, i.e., the output data of the corresponding operational unit 2-5 that receives the output of the corresponding flag register 2-3. When the signal SELCYCLEp<3> is at "H", each multiplexer 2-6 outputs its fourth input data from the left in FIG. 5, i.e., the output data of the corresponding operational unit 2-5 that receives the output of the corresponding flag register 2-4. As a result, when a predetermined latency has elapsed after the input of a read command or write command, the data captured at the first cycle (i.e., the data stored in the data register 2-1) can be output as TDIINp, and the value obtained from the data captured at the first cycle and pre-loaded flag data (i.e., the data stored in the flag registers 2-2 to 2-4) can be output as TDIINp during the time from the second to fourth cycles.

In the above description, the number of flag data items stored in the flag registers is smaller by one than the number of cycles. However, these numbers may be set equal. In this case, it is sufficient if one more flag register and operational unit are increased. Specifically, at the first cycle, the value obtained by the additional operational unit from the data stored in the data register 2-1 and the data stored in the additional flag register is output as TDIINp. As a result, the number of flag data items stored in the flag registers is equal to the number of cycles during which data TDIINp is output.

FIG. 6 is a circuit diagram illustrating the configuration of the test data output time-series compression circuit 1-4 incorporated in the memory macro 1-0. The read command RDp is the first input of a shift register that is formed of a flip-flop 3-1 for adjusting the latency of read data. The final output of the flip-flop 3-1 is input to one input terminal of an OR circuit 3-2. The other input terminal of the OR circuit 3-2 receives the inverted signal of the signal CCMODEp. The output of the OR circuit 3-2 is a signal RSTp.

The signal RSTp is input to one input terminal of an OR circuit 3-3. The other input terminal of the OR circuit 3-3 receives data TDOy<k> (k=0, 1, 2, 3) as the output of a flip-flop 3-5. The output of the flip-flop 3-5 is input to one input terminal of an AND circuit 3-4. The other input terminal of the AND circuit 3-4 receives data TFAILn<k> (k=0, 1, 2, 3) output from the test input/output data control circuit 1-2. The output of the AND circuit 3-4 is input to the flip-flop 3-5.

The data TDOy<k> as the output of the flip-flop 3-5 is input to one input terminal of a multiplexer 3-6. The other input terminal of the multiplexer 3-6 receives data TDO<k> (k=0, 1, 2, 3) as the output of a flip-flop 3-7. The signal selection terminal of the multiplexer 3-6 receives a signal (not shown) obtained by imparting a flip-flop function to the signal RSTp. The output of the multiplexer 3-6 is the input of the flip-flop 3-7. The flip-flop 3-7 outputs data TDO<k>.

If the present mode is not the compression mode, the signal CCMODEp is at "L", therefore the signal RSTp output at every cycle from the OR circuit 3-2 is activated to assume the "H" level. As a result, the output level of the OR circuit 3-3 becomes "H", thereby capturing the data TFAILn<k> and outputting the data TDOy<k> and TDO<k> at every cycle.

In the compression mode, the signal RSTp becomes "H" when a predetermined latency has elapsed after the input of the read command RDp. Once the level of the data TDOy<k> lowers to "L", it keeps "L" unless the signal RSTp becomes "H". Accordingly, if the level of the signal RSTp lowers to "L" even once during the cycle of input of the read command RDp, the data TDOy<k> lowers to "L". The multiplexer 3-6 and flip-flop 3-7 keep the data TDO<k> at "L" until the next read command is input.

FIG. 7 is a circuit diagram illustrating the configuration of the block address time-series compression circuit 1-6 incorporated in the memory macro 1-0. A flip-flop unit 5-1 is a flip-flop group for adjusting the latency required from command input to block address input. The final output of the flip-flop unit 5-1 is connected to one input terminal of an OR circuit 5-2. The other input terminal of the OR circuit 5-2 receives the inverted signal of the signal CCMODEp. The signal CCMODEp is activated to assume the "H" level in the compression mode, and assumes the "L" level not in the compression mode. Accordingly, the output of the OR circuit 5-2 always assumes the "H" level if the present mode is not the compression mode.

The output of the OR circuit 5-2 is input to the terminal C of a block selecting/holding register 5-3. The block selecting/holding register 5-3 operates in the same manner as the "0 cycle" data register 2-1. A signal TBS<h> (h=0, 1, . . . , m) is input to the terminal D of the block selecting/holding register 5-3. A signal TBSINp<h> is output from the terminal O of the block selecting/holding register 5-3. In the compression mode, when a predetermined latency has elapsed after a read or-write command is input, the above circuit enables the signal TBS<h> to be held until the next read or write command is input.

Figure 8:
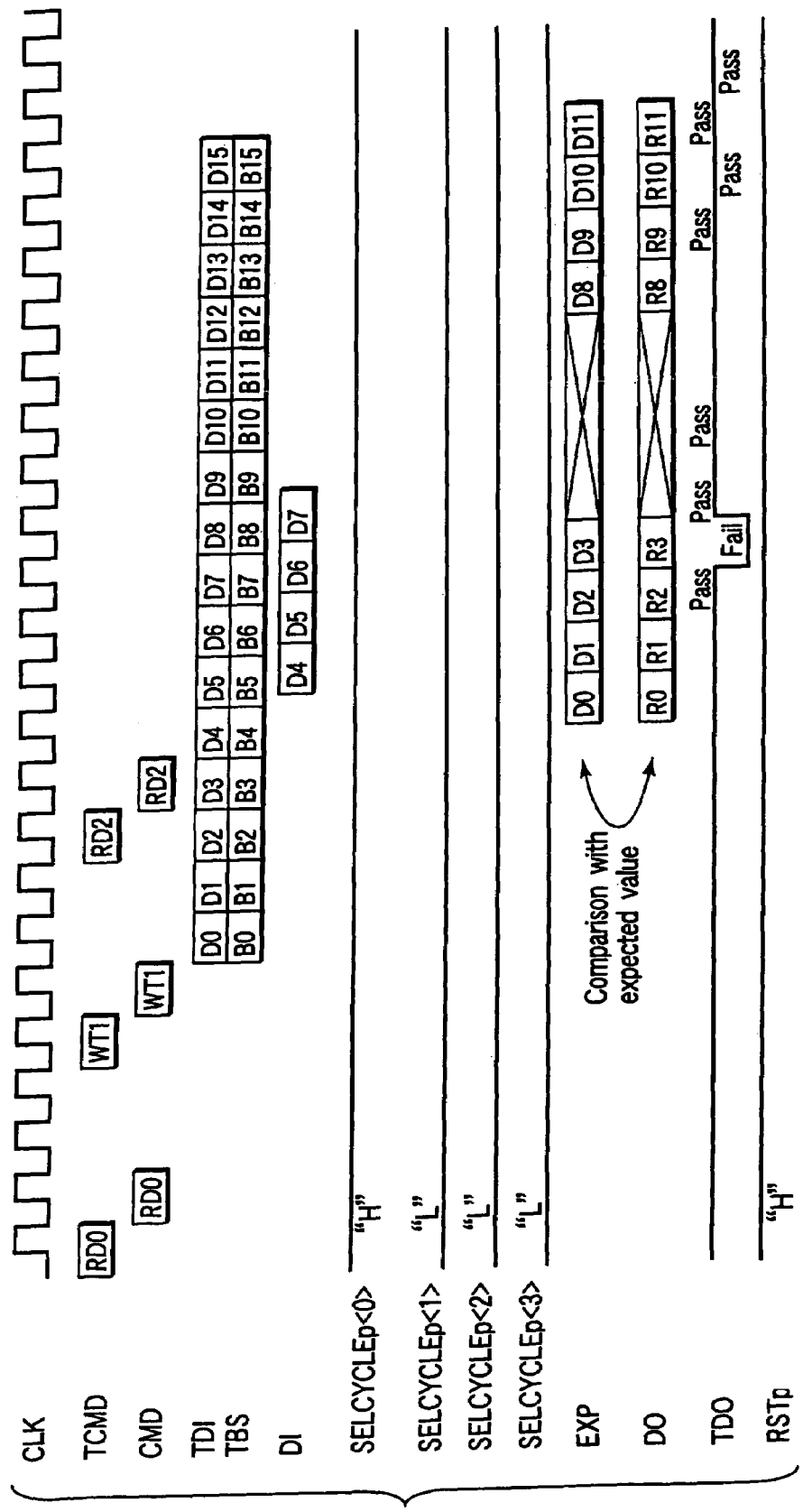
FIG. 8 is a view of waveforms useful in explaining the operation of the semiconductor memory device of the first embodiment that is assumed when the device is not in a compression mode.
Figure 9:
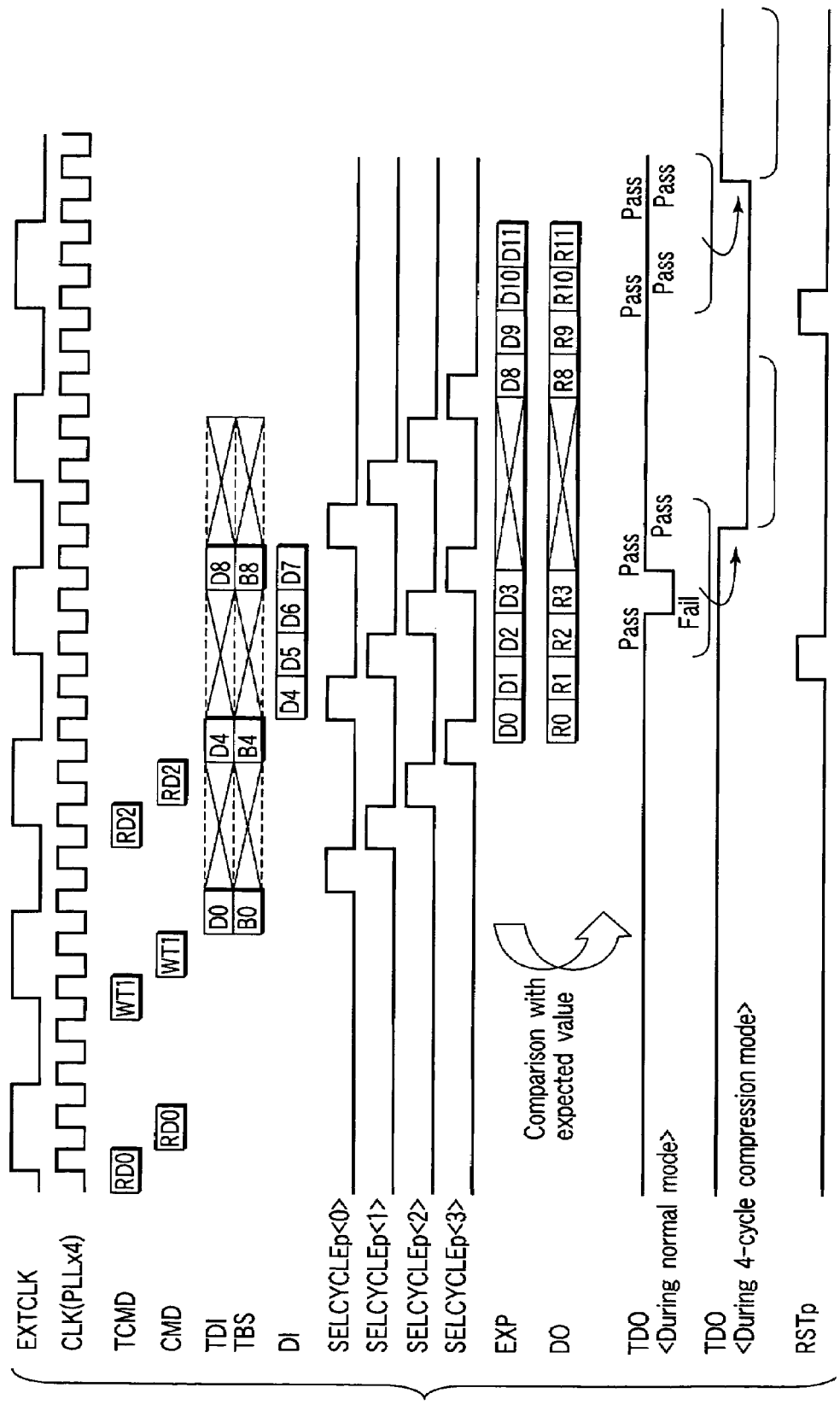
FIG. 9 is a view of waveforms useful in explaining the operation of the semiconductor memory device of the first embodiment that is assumed when the device is in the compression mode.

FIGS. 8 and 9 show waveforms useful in explaining the operation of the semiconductor memory device of FIG. 2. FIG. 8 shows waveforms assumed when the device is not in the compression mode. The waveforms are similar to those seen in the prior art except that the levels of the signals SELCYCLEp<0:3> and RSTp are fixed.

FIG. 9 shows waveforms assumed in the compression mode. It is supposed that the frequency of an internal clock CLK is four times higher than an external clock EXTCLK. A test command TCMD indicates the timing of input of the write command WTp or read command RDp. One latency (corresponding to one clock pulse) is required for capturing the write or read command. This is indicated by a command CMD. In the case of FIG. 9, a read command RD0, write command WT1 and read command RD2 are sequentially input at every fourth clock pulse CLK. Addresses are input at the same timing as the commands (this is not shown).

Test data TDI is supplied to each of the test data input lines TDI<0:3> six clock pulses later than the input of a command. When a write command is input, data of four cycles is input. When the initial data D4 is input, the signal SELCYCLEp<0> is activated to assume the "H" level, thereby causing the corresponding "0 cycle" data register 2-1 to capture the data D4. From the data captured by the "0 cycle" data register 2-1, and pre-loaded flag values, data times D5, D6 and D7 are created. Thereafter, the signal SELCYCLEp<1>, signal SEL-CYCLEp<2> and signal SELCYCLEp<3> are sequentially activated to assume the "H" level, thereby supplying the test input/output data control circuit 1-2 with data items D5, D6 and D7 as the data TDIINp. Further, using the write command WT1, the data items D4 to D7 are written to the block selected by data B4 input as the block selection address TBS.

Data items D0 and D8 input six clock pulses later than the read commands RD0 and RD2, respectively, are input as the test data TDIINp to the test input/output data control circuit 1-2 by the same processing as that performed when inputting a write command. These data items are used as expected values EXP when a predetermined latency has elapsed. Also in this case, data items D1, D2 and D3 are automatically created as a result of the computation of the data D0 and flag data items, while data items D9, D10 and D11 are automatically created as a result of the computation of the data D8 and flag data items. Thus, a predetermined test can be performed on the memory macro 1-0 by inputting, at every fourth cycle, the test command TCMD, test data for each test data input line TDI<0:3>, and block selection address TBS. This enables the internal memory to be tested at high speed using a quadruple-speed PLL. Further, a PLL can reduce the time required for a test.

On the other hand, test data TDO generated from each test data output line TDO<0:3> assumes the "Pass" state ("H" level) or "Fail" state ("L" level) in the normal mode at every cycle, as is shown in FIG. 9. Specifically, the data items D0, D1, D2 and D3 as expected data EXP are compared with the data items R0, R1, R2 and R3 as output data DO, respectively. If the expected data is identical to the output data DO, the test data TDO assumes the "H" level ("Pass" state), whereas if they are not identical, the test data TDO assumes the "L" level ("Fail" state). However, the signal RSTp is activated to assume the "H" level at every fourth cycle (in the case of FIG. 9, the signal RSTp assumes the "H" level at every eighth cycle since the write command WT1 is generated between the read commands RD0 and RD2). Therefore, the output of the test data output time-series compression circuit 1-4 is a pulse signal of a pulse width equal to four clock pulses, and it is sufficient if the test data output time-series compression circuit 1-4 outputs a signal at every fourth cycle. Since, however, data of four cycles is compressed, one condition is required to use the output of the test data output time-series compression circuit 1-4 for a die sort (D/S) test using a redundancy function, i.e., defective-saving function. The condition is that the compressed data of four cycles should exist in the same block corresponding to a spare block. In the case of a DRAM combined with a logic circuit, since it employs a system in which to-be-compressed four-cycle data is replaced with data in the spare block in the same input/output line each time data input or output is performed, to-be-spared data of four cycles may well exist in the same block corresponding to a spare block (the same can be said of a row address).

As described above, the first embodiment employs, for each test input data line, registers for prestoring a number j (j is a natural number not less than 2) of flag data items, and a data register for storing the data input at a time corresponding to the time of command input. The first embodiment further employs the test data input time-series compression circuit 1-3 for internally generating data by computation of flag data and input data during the time ranging from the data input time corresponding to the input of a command, to the j-th cycle, and sequentially inputting the generated data to the memory core 1-1. The first embodiment also employs the test data output time-series compression circuit 1-4 for outputting "Fail" information corresponding to a number j of cycles, if even one cycle of "Fail" data is contained in the data of a number j of cycles output when a number j of cycles of test input data items are read. This structure enables the internal memory to be tested at high speed, using an external low-speed tester and internal PLL.

Figure 11:
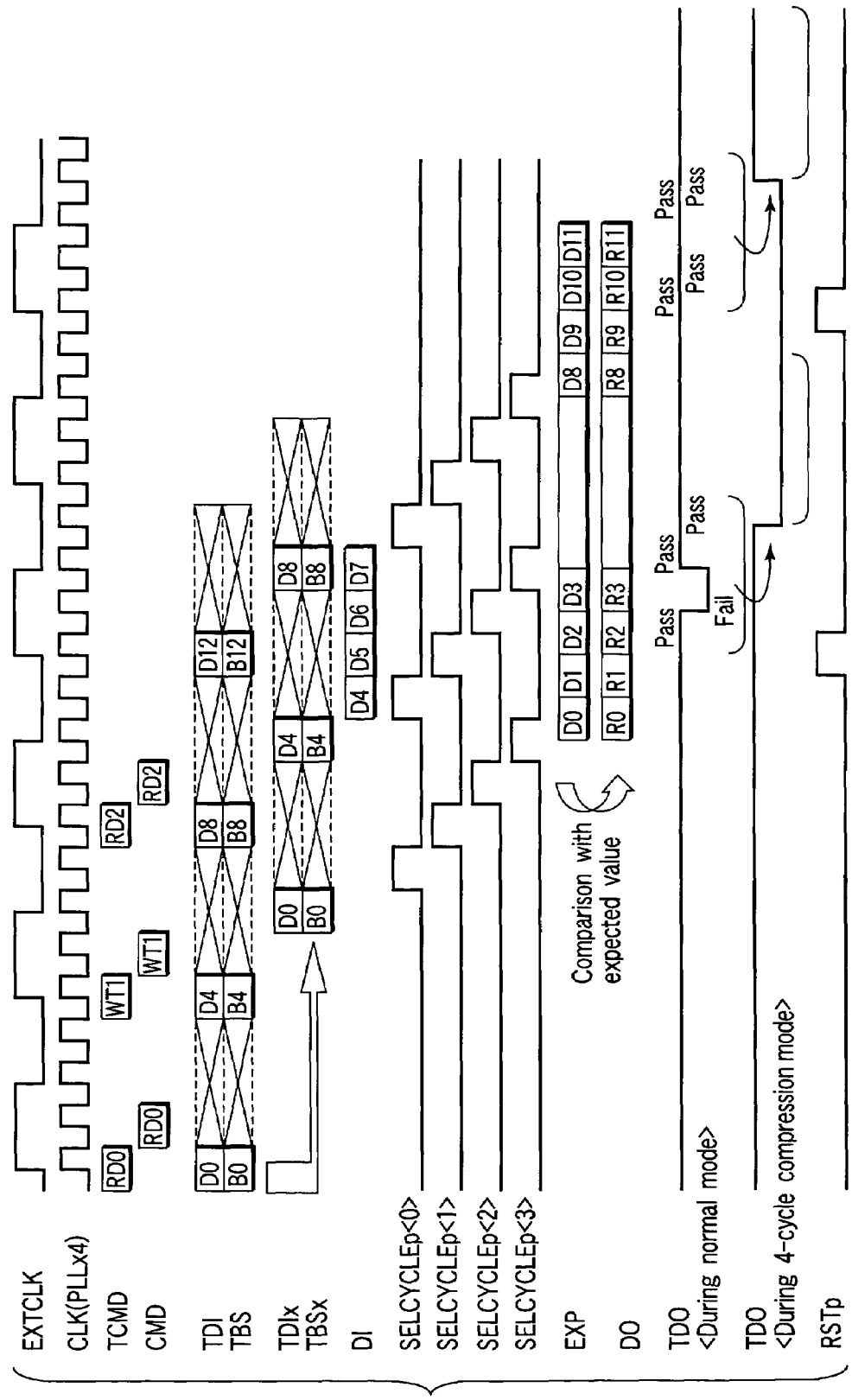
FIG. 11 is a view of waveforms useful in explaining the operation of the semiconductor memory device of the modification of the first embodiment.
Figure 12:
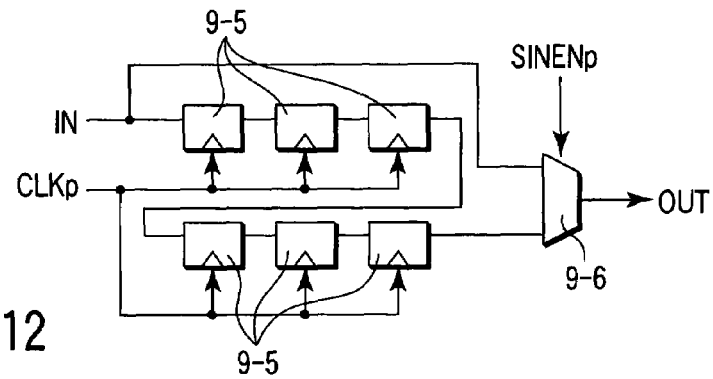
FIG. 12 is a circuit diagram illustrating the configuration of a data command simultaneous input enabling circuit incorporated in the modification of the first embodiment.

Since command input and data input are not performed simultaneously, it may be difficult to input external data. In this case, a data command simultaneous input enabled circuit 9-1 is disposed before each of the test data input time-series compression circuit 1-3 and block address time-series compression circuit 1-6. This enables the operations illustrated in FIG. 11. In this case, it is sufficient if data and a command are input from outside at every fourth cycle. FIG. 12 shows the data command simultaneous input enabled circuit 9-1. The data command simultaneous input enabled circuit 9-1 has a shift register and multiplexer 9-6. The shift register comprises a plurality of flip-flops 9-5. The multiplexer 9-6 receives the initial input and final output of the shift register, and outputs one of the inputs in accordance with a selection signal SINENp.

SECOND EMBODIMENT

A semiconductor memory device according to a second embodiment of the invention will be described. In the second embodiment, elements similar to those in the first embodiment are denoted by corresponding reference numerals, and no description is given thereof.

In the first embodiment, the time required for a test can be shortened if a PLL is used, but cannot be shorted without the PLL. Therefore, unless the PLL is used in all tests, a sufficient time shortening effect cannot be obtained.

Figure 13:
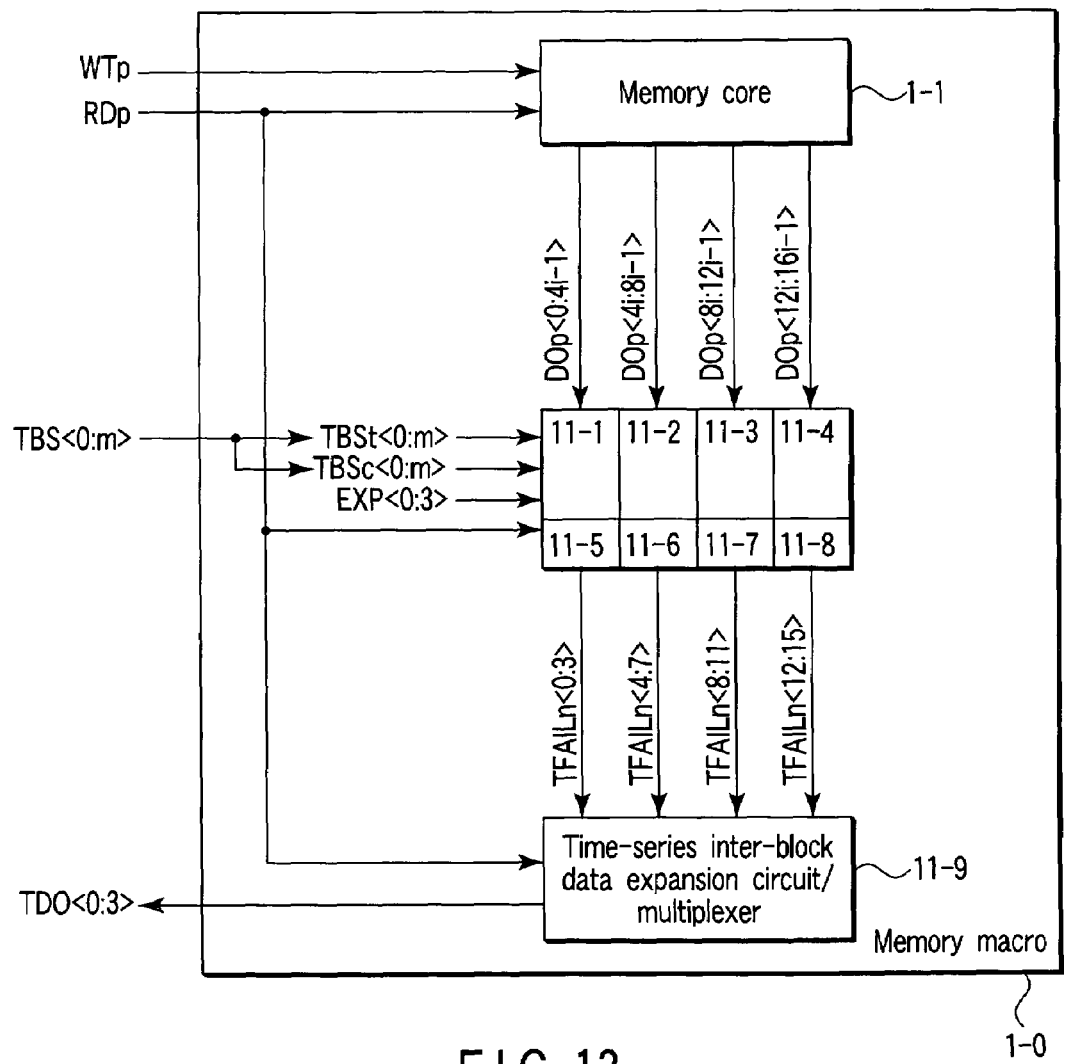
FIG. 13 is a block diagram illustrating a semiconductor memory device according to a second embodiment of the invention.

FIG. 13 is a block diagram illustrating the configuration of the semiconductor memory device of the second embodiment. FIG. 13 only shows the signals related to data output. The signals related to data input are similar to those shown in FIG. 2.

The memory core 1-1 is divided into four block groups, and the output of the memory core 1-1 is divided into four output components. Each block group comprises one or more blocks (these blocks are similar to the blocks employed in the first embodiment). A number j of block groups and a number (n+1) of blocks satisfy the relationship "j×h=n+1" (h is a natural number not less than 1). Comparator/multiplexer circuits (comparison/selection circuits) 11-1 to 11-4 are provided for data DOp<0:4$i$−1>, data DOp<4$i$:8$i$−1>, data DOp<8$i$:12$i$−1> and data DOp<12$i$:16$i$−1>, respectively. The outputs of the comparator/multiplexer circuits 11-1 to 11-4 are input to the input terminals of test data output time-series compression circuits 11-5 to 11-8, respectively. Further, data TFAILn<0:3>, data TFAILn<4:7>, data TFAILn<8:11> and data TFAILn<12:15> output from the test data output time-series compression circuits 11-5 to 11-8, respectively, are output as test data TDO<0:3> through a time-series inter-block expanded circuit/multiplexer 11-9. The comparator/multiplexer circuits 11-1 to 11-4 have the same function as the comparator/multiplexer 4-4. The test data output time-series compression circuits 11-5 to 11-8 have the same function as the test data output time-series compression circuit 1-4.

FIG. 14 is a circuit diagram illustrating the configuration of the time-series inter-block data expansion circuit/multiplexer 11-9. The read command RDp is input as a signal SELBp<0> to the leading counter flip-flop 12-2 via flip-flops 12-1 for read latency adjustment. The outputs of the counter flip-flops 12-2 are signals SELBp<1>, SELBp<2> and SELBp<3>, respectively. The counter flip-flops 12-2 are reset by the signal SELBp<0>.

Data items TFAILn<k>, TFAILn<4+k>, TFAILn<8+k> and TFAILn<12+k> (k=0, 1, 2, 3) output from the test data output time-series compression circuits 11-5 to 11-8 are input to a multiplexer 12-3 and AND circuit 12-4. The multiplexer 12-3 operates in accordance with the signals SELBp<0:3>. If the signal SELBp<0> is activated to assume the "H" level, the multiplexer 12-3 selects and outputs the data TFAILn<k>. If the signal SELBp<1> is activated to assume the "H" level, the multiplexer 12-3 selects and outputs the data TFAILn<4+k>. Similarly, if the signal SELBp<2> is activated to assume the "H" level, the multiplexer 12-3 selects and outputs the data TFAILn<8+k>, and if the signal SELBp<3> is activated to assume the "H" level, the multiplexer 12-3 selects and outputs the data TFAILn<12+k>.

The outputs of the multiplexer 12-3 and AND circuit 12-4 are input to a multiplexer 12-5. The multiplexer 12-5 operates in accordance with a signal TMODEBXp indicative of an inter-block expansion mode. If the signal TMODEBXp is activated to assume the "H" level, the multiplexer 12-5 outputs the output of the multiplexer 12-3 as the test data TDO<k>. This enables the output of the time-series compressed data of the block groups that varies in units of cycles. Further, if the signal TMODEBXp is inactivated to assume the "L" level, the multiplexer 12-5 outputs the output of the AND circuit 12-4 as the test data TDO<k>. This enables a multiplex function to be executed between the block groups.

Figure 15:
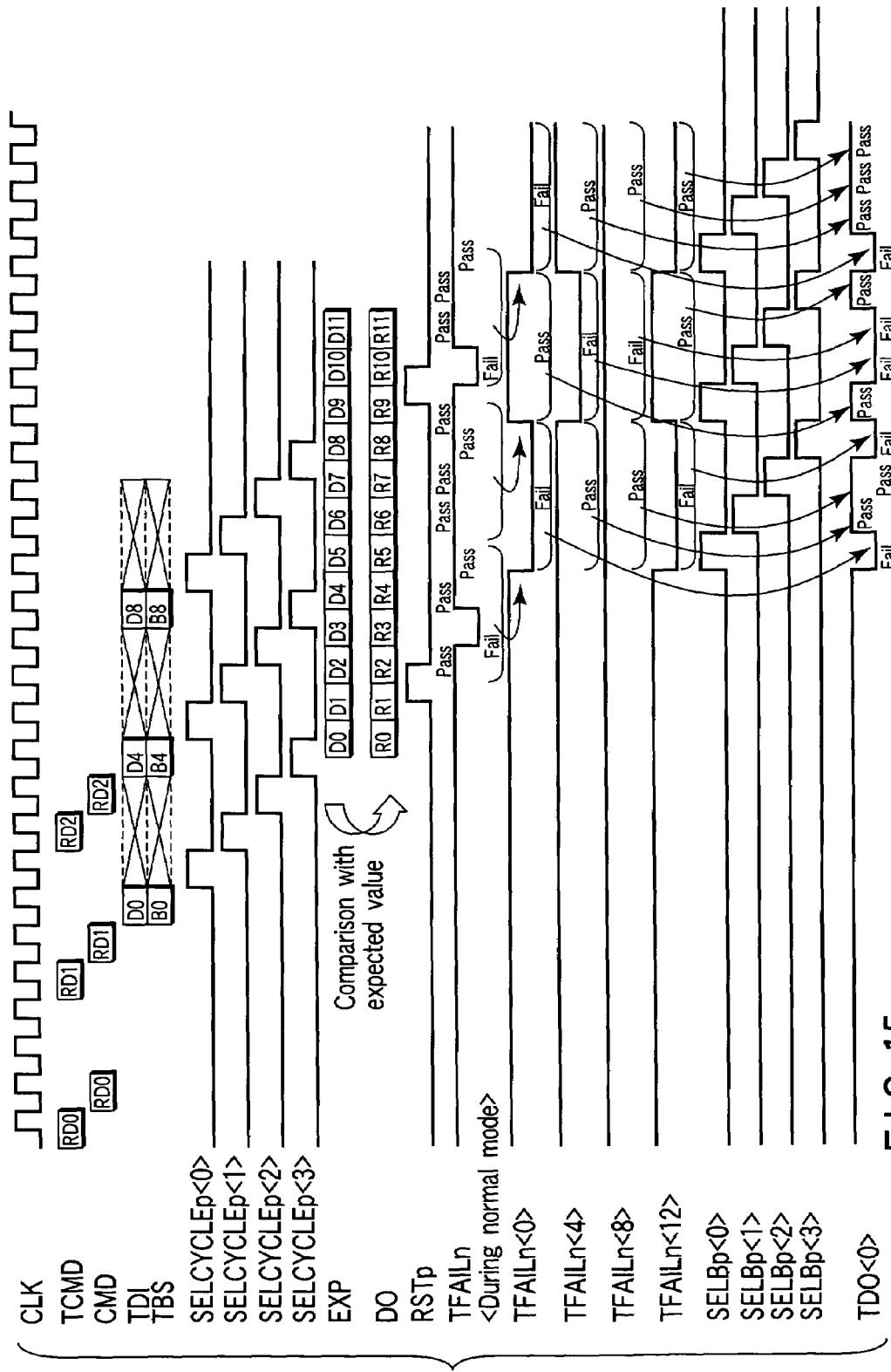
FIG. 15 is a view of waveforms useful in explaining the operation of the semiconductor memory device of the second embodiment.

FIG. 15 is a view of waveforms useful in explaining the operation of the semiconductor memory device of FIG. 14. As indicated by the test command TCMD, the read commands RD0, RD1 and RD2 are sequentially generated at every fourth cycle. The waveforms of input signals are similar to those in the case of FIG. 9, therefore no description is given thereof.

The data TFAILn generated in the normal mode has its level changed between the "Pass" state and "Fail" state in units of clock CLK pulses. However, in this case, since data is compressed at every fourth cycle, AND information of four cycles is output as the data TFAILn over four cycles. Specifically, data items are output from the respective block groups as data items TFAILn<0>, TFAILn<4>, TFAILn<8> and TFAILn<12>. At the initial four cycles, the respective output data items have the "Fail", "Pass", "Pass" and "Fail" states. At the next four cycles, the respective output data items have the "Pass", "Fail", "Fail" and "Pass" states. At the last four cycles, the respective output data items have the "Fail", "Pass", "Pass" and "Pass" states.

When the data TDO is output, at the initial cycle, the signal SELBp<0> is activated to assume the "H" level, thereby outputting the data TFAILn<0> ("Fail") as the data TDO. At the next cycle, the signal SELBp<1> is activated to assume the "H" level, thereby outputting the data TFAILn<4> ("Pass") as the data TDO. At the third cycle, the signal SELBp<2> is activated to assume the "H" level, the data TFAILn<8> ("Pass") is output as the data TDO. At the fourth cycle, the signal SELBp<3> is activated to assume the "H" level, the data TFAILn<12> ("Fail") is output as the data TDO. Further, during the next four cycles, data items of "Pass", "Fail", "Fail" and "Pass" states are sequentially output as the data TDO. During the last four cycles, data items of "Fail", "Pass", "Pass" and "Pass" states are sequentially output as the data TDO. As a result, even if no PLL is used (even if the clock CLK in FIG. 15 is an external clock), compressed data can be output at every cycle, thereby significantly reducing the time required for the test.

Figure 16:
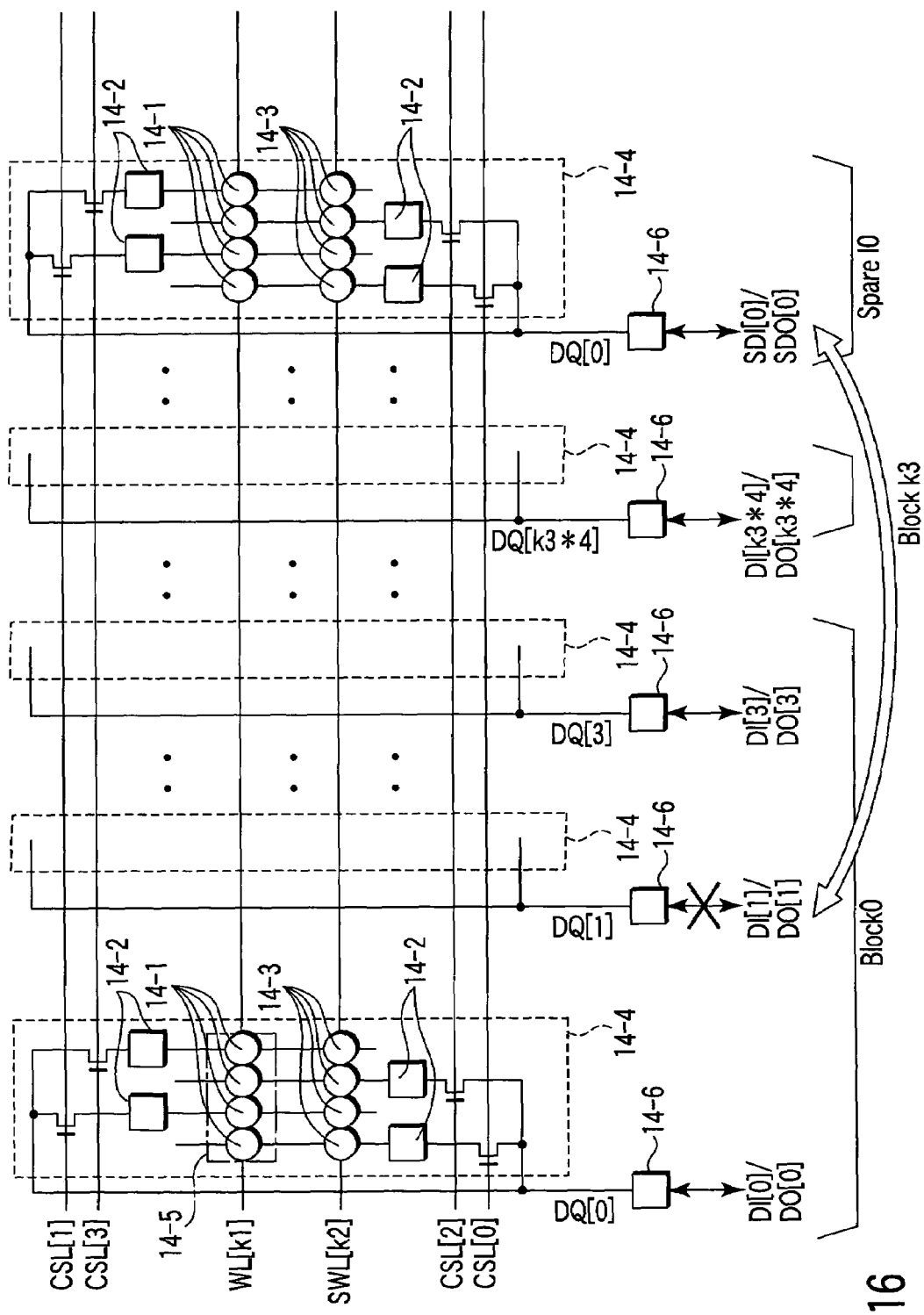
FIG. 16 is a schematic view illustrating a redundancy circuit incorporated in the semiconductor memory devices of the first and second embodiments.

FIG. 16 is a schematic view illustrating a redundancy circuit incorporated in the semiconductor memory devices of the first and second embodiments. In the figure, reference numeral 14-1 denotes each 1-bit memory cell. When a word line WL[k1] (k1 is a natural number including 0) selected using a row address is activated, the data stored in the memory cells 14-1 connected to the word line WL[k1] is read by a sense amplifier 14-2. Subsequently, the data selected by a column selection line CSL[k4] (k4=0, 1, 2, 3) that is selected by a column address is read as data DO via a data line DQ[0] and DQ buffer 14-6. Further, data DI is written to the memory cells 14-1 selected by the word line WL[k1] and column selection line CSL[k4].

A redundant (spare) word line SWL[k2] is connected to redundant (spare) memory cells 14-3. If a word line WL is defective, it is replaced with the redundant word line SWL[k2]. When the defective word line is selected, the redundant word line SWL[k2] is activated to access the redundant memory cells 14-3.

If the data line DQ in the column direction is defective, replacement of an input/output circuit (IO) is performed. For example, if a data input/output circuit IO[1] is defective, a data input/output circuit DI[1]/DO[1] is replaced with a spare (redundant) data input circuit SDI[0]/SDO[0].

A to-be-replaced unit 14-4 is a minimum unit to be replaced with a spare unit when the data line DQ is replaced with a spare one, and contains, for example, memory cells of four bits or eight bits determined from the restrictions of layout. Replacement of the data line DQ is performed in units of to-be-replaced units 14-4. A to-be-replaced unit 14-5 is a minimum unit used for replacing memory cells arranged in both row and column directions. The unit 14-5 contains memory cells of, for example, four bits also determined from the restrictions of layout. Irrespective of which one of the memory cells contained in the unit 14-5 is defective, the same redundant (spare) address is obtained. The bits of the unit 14-5 can be compressed in a test for saving if there is information indicating that at least one of the bits is defective. In the embodiment shown in, for example, FIG. 9, it is important that the number j (in the case of FIG. 9, j=4) of bits compressed in a time-series manner is equal to the bits of the unit 14-5. By making the number of bits of compressed data equal to the number of bits of a to-be-replaced unit, the time required for reading during a test before saving can be reduced to 1/j, thereby shortening the time for the test. The blocks shown in FIG. 16 are identical to those into which the memory core is divided during the input/output test performed in the second embodiment shown in FIG. 13.

The above-described embodiments provide semiconductor memory devices whose internal memory can be tested at high speed using its internal PLL and a clock signal from an external low-speed tester. Further, they provide semiconductor memory devices whose internal memory can be tested in a short time using a clock signal from an external low-speed tester, and without using the internal PLL.

Each of the above-described embodiments contains inventions of various stages. Such inventions can be realized by appropriately combining elements disclosed in the above-described embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory core including a plurality of memory cells arranged in rows and columns and storing data, the memory core further including a plurality of spare memory cells configured to replace the memory cells when any one of the memory cells is defective, the memory core also including a to-be replaced unit of a preset number of memory cells included in the plurality of memory cells, the to-be replaced unit being replaceable in any one of the rows and the columns when the to-be replaced unit is replaced with the spare memory cells, the to-be replaced unit being provided at an intersection of a first memory cell region and a second memory cell region, the first memory cell region being simultaneously replaceable with memory cells of one of the rows, the second memory cell region being simultaneously replaceable with memory cells of one of the columns;
a data register which stores test data input corresponding to input of a command;
a data control circuit configured to read a number j (j is a natural number not less than 2) of data items from the memory cells of the data items from memory cells included in the to-be replaced unit included in the to-be-replaced unit in synchrony with a clock signal; and
a data output compression circuit configured to use the test data as an expected value, and compare each of the number j of the data items, read from the memory cells in synchrony with the clock signal, with the expected value, the data output compression circuit outputting, for a period corresponding to j cycles, information indicating that the data items are not equal to the expected value, if at least one of the data items is not equal to the expected value.

2. The semiconductor memory device according to claim 1, further comprising:
an address register which stores a block address signal input corresponding to input of the command and used to select some of blocks into which the memory core is divided; and
a block address compression circuit configured to output the block address signal from the address register to the data control circuit during a number j of cycles of the clock signal.

3. The semiconductor memory device according to claim 2, wherein the test data includes first test data items used as expected values, and further comprising a comparison selection circuit configured to compare the data items, read from the some blocks selected by the block address signal, with the respective expected values, thereby outputting a plurality of information items each indicating whether each of the data items is equal to a corresponding one of the expected values.

4. The semiconductor memory device according to claim 3, wherein the data output compression circuit is connected to an output side of the comparison selection circuit, and used to generate output data.

5. The semiconductor memory device according to claim 2, further comprising a data command simultaneous input circuit if the semiconductor memory device is constructed such that the test data and the block address signal are not input together with input of the command for accessing the semiconductor memory device, the data command simultaneous input circuit having a register which delays the input of the test data and the block address signal by a latency of the input of the command, the data command simultaneous input circuit simultaneously receiving the command, the test data and the block address signal.

6. The semiconductor memory device according to claim 1, wherein the test data includes test data items used as expected values, and
further comprising:
an address register which stores a block address signal used to select some of blocks into which the memory core is divided, the block address signal being input corresponding to input of the command;
a comparison selection circuit configured to compare the data items, read from the some blocks selected by the block address signal, with the respective expected values, thereby outputting a plurality of information items each indicating whether each of the data items is equal to a corresponding one of the expected values; and
a data expansion circuit configured to select and output an output signal of the data output compression circuit at a (k: 1, 2, . . . , j) cycle of the clock signal, the output signal corresponding to a block group included in a number j of block groups, the blocks being grouped into the number j of block groups ranging from a first block group to a j-th block group, test data read from each of the block groups being input to the data output compression circuit via the comparison selection circuit.

7. The semiconductor memory device according to claim 6, wherein the data expansion circuit outputs, during the number j of cycles of the clock signal, an output signal of the data output compression circuit corresponding to the some blocks selected by the block address signal.

8. The semiconductor memory device according to claim 6, wherein each of the block groups includes at least one the block, and if each of the block groups includes a plurality of the blocks, the blocks are located close to each other.

* * * * *